United States Patent [19]

Feldman

[11] Patent Number: 4,581,544
[45] Date of Patent: Apr. 8, 1986

[54] DELAYED MONOSTABLE MULTIVIBRATOR

[75] Inventor: Alan S. Feldman, Phoenix, Ariz.
[73] Assignee: Sperry Corporation, New York, N.Y.
[21] Appl. No.: 465,932
[22] Filed: Feb. 14, 1983
[51] Int. Cl.$^4$ .................. H03K 3/284; H03K 5/153
[52] U.S. Cl. ................................ 307/273; 307/350; 307/360
[58] Field of Search ............ 307/273, 261, 265, 266, 307/269, 272 R, 350, 351, 354, 360, 593, 608; 328/147, 150, 146

[56] References Cited

U.S. PATENT DOCUMENTS

| | | | |
|---|---|---|---|
| 3,611,164 | 10/1971 | Day | 307/351 |
| 3,968,449 | 7/1976 | Dunnam | 307/273 |
| 3,989,959 | 11/1976 | Renirie et al. | 328/147 |
| 4,160,175 | 7/1979 | Trout | 307/351 |
| 4,362,996 | 12/1982 | Priebe | 307/351 |

FOREIGN PATENT DOCUMENTS 0150612 11/1980 Japan .................. 307/273

OTHER PUBLICATIONS

Subramanian, "Retriggerable Monostable Using a Dual Comparator", New Electron (Great Britian), vol. 12, No. 22, 11/13/79.
National Semiconductor Linear Integrated Circuit Data Book, pp. 5-30.

Primary Examiner—Stanley D. Miller
Assistant Examiner—Timothy P. Callahan
Attorney, Agent, or Firm—Howard P. Terry; Seymour Levine

[57] ABSTRACT

A buffer comparator receives input pulses and produces buffer output signals that drive first and second output comparators arranged to operate as an amplitude-sensitive logic circuit that produces a high level output signal when and only when the internal driving signals have an amplitude between first and second threshold levels. In one embodiment, the output of the buffer comparator is applied directly to the non-inverting input terminal of the first logic circuit comparator and through a low resistance resistor to an R-C network and the inverting terminal of the second logic circuit comparator. The remaining input terminals on the logic comparators are connected to a multiple voltage divider that provides lower and upper threshold voltages to the respective comparators. An input pulse applied to the buffer comparator initiates an internal driving signal that charges the capacitor in the R-C network exponentially. While the voltage on the capacitor rises between the lower and upper threshold levels the logic comparators produce a high level output signal. When the input signal terminates, the low resistance resistor reverses the ordinary switching sequence of the logic comparators and prevents the formation of an output pulse at this time. A second embodiment of the invention dispenses with the means to reverse the ordinary switching sequence during discharge of the capacitor in the R-C network and thus provides a second positive-going output pulse at this time.

6 Claims, 4 Drawing Figures

DELAYED MONOSTABLE MULTIVIBRATOR

BACKGROUND OF THE INVENTION

1. Field of the Invention

The present invention relates to electrical pulse generating circuits and more specifically to monostable multivibrator circuits.

2. Description of the Prior Art

Monostable multivibrators or "one-shots" have proven to be one of the most useful pulse generating circuits ever devised. One reason for the popularity of these circuits is that a wide variety of input signals can be used to trigger the one-shot so as to produce an output pulse of precise amplitude and duration. In some circuits, the inception of the output pulse can be delayed for a known length of time after the occurrence of an input pulse so that the timing of the output pulse as well as its amplitude and duration can be closely controlled. With the advent of integrated circuits multiple transistor-transistor logic one-shot circuits were connected together in "daisy chains" to provide these desired characteristics. However such complex circuits require excessive de-coupling, such as the use of ground planes and shielding or other techniqhes to achieve acceptable performance. Such techniques proved to be unreliable, cumbersome, and expensive. Furthermore, such circuits were lacking in reliability and were difficult to adjust.

The circuit of the present invention has excellent noise immunity and requires none of the aforementioned noise reducing techniques. The present circuit also may be readily adjusted over many decades of pulse delay and duration.

SUMMARY OF THE INVENTION

The delayed monostable multivibrator of the present invention includes an input buffer comparator for producing internal driving signals that are applied to a pair of output comparators arranged in an amplitude-responsive logic circuit that produces a high level output voltage only when the internal driving signals have an amplitude between lower and upper threshold values. The signal from the buffer comparator is applied directly to the output comparator that is responsive to the lower threshold value and through a low resistance resistor and R-C timing network to the output comparator responsive to the higher threshold value. When an input pulse triggers the buffer comparator, the internal driving signals rise exponentially because of the R-C timing circuit so as to reach the first and second threshold levels only after first and second delays, respectively. At the termination of an input pulse, the aforementioned low resistance resistor effectively reverses the normal operating sequence of the logic circuit thereby preventing the formation of a spurious output pulse at this time.

DESCRIPTION OF THE PREFERRED EMBODIMENTS

Figure 1:
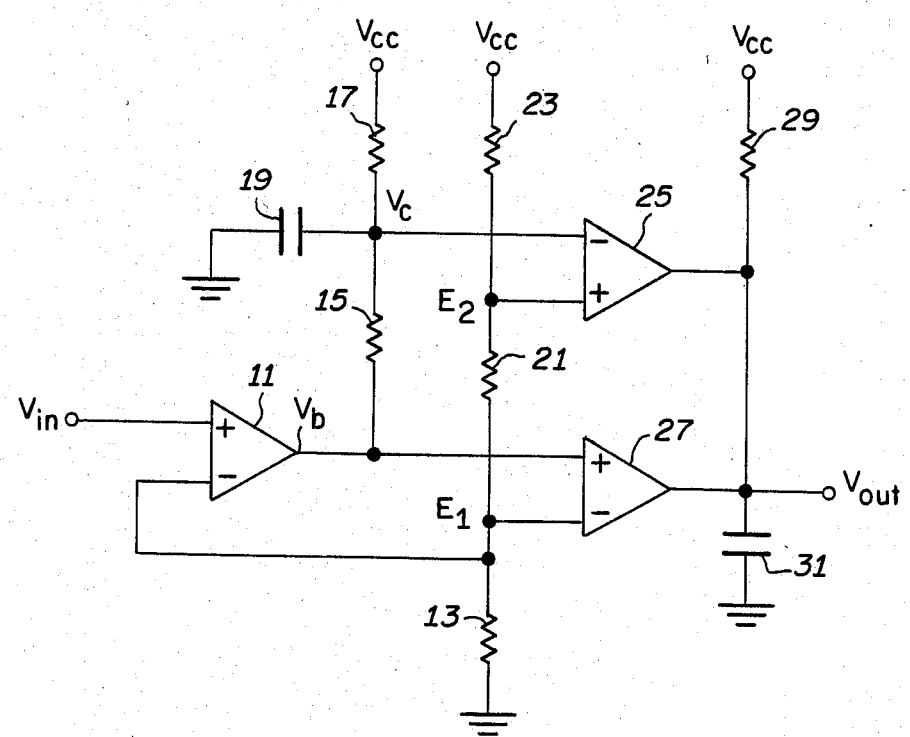
FIG. 1 is a circuit diagram and truth table useful in explaining the principles of the invention.

Referring now to FIG. 1, a delayed monostable multivibrator employing the principles of the invention includes a first comparator 11 coupled to receive input signals at its non-inverting input terminal and having its inverting input terminal coupled to ground through a resistor 13. The comparator 11 is a well known device which produces a positive output signal of known magnitude whenever the input signal becomes more positive than the voltage applied to its inverting terminal.

As presently preferred, and as indicated in FIG. 1, the comparator 11 may consist of an integrated circuit device, such as a commercially available type LM139 quad comparator. The comparator 11 is connected to operate between a positive potential $V_{cc}$ and ground.

The output of the comparator 11 initiates the internal driving signals of the device, and is coupled to the source $V_{cc}$ through a time delay means comprising a relatively low resistance coupling resistor 15 and R-C network formed from a resistor 17 and a capacitor 19. A multiple voltage divider includes the resistors 13, 21, and 23 coupled between the voltage source $V_{cc}$ and ground and serves as a source of reference voltages for a comparator 25 and a comparator 27. The inverting input terminal of the comparator 25 is connected to the junction of the capacitor 19 and the resistors 15 and 17 in the time delay means. The non-inverting input terminal of the comparator 27, together with the resistor 15 is connected to the output of the buffer comparator 11. The output terminals of the comparators typically may be connected to a pull-up and filtering circuit including the resistor 29 and the capacitor 31.

The resistor 17 and the capacitor 19 are selected to provide a suitable charging rate for the particular application in which the circuit is to be used, so that their values are largely a matter of choice in design. As will be explained, the value of resistor 15 is selected to be much smaller than resistor 17.

The values of the resistors 13, 21, and 23 in the multiple voltage divider are selected to provide threshold level voltages $E_1$ and $E_2$ such that comparator 27 will be triggered when the charge on the capacitor 19 reaches a first specified value and the comparator 25 will be triggered when the capacitor charge later reaches a second specified higher value.

Comparators 25 and 27 function as an amplitude-sensitive logic circuit in the manner depicted in the truth table of FIG. 1. As can be seen from that table, the output of combined comparators 25 and 27 is low when the voltages applied to their active input terminals is either higher or lower than both $E_1$ and $E_2$, and is high only when the voltages applied to these active terminals lie between $E_1$ and $E_2$.

Figure 2:
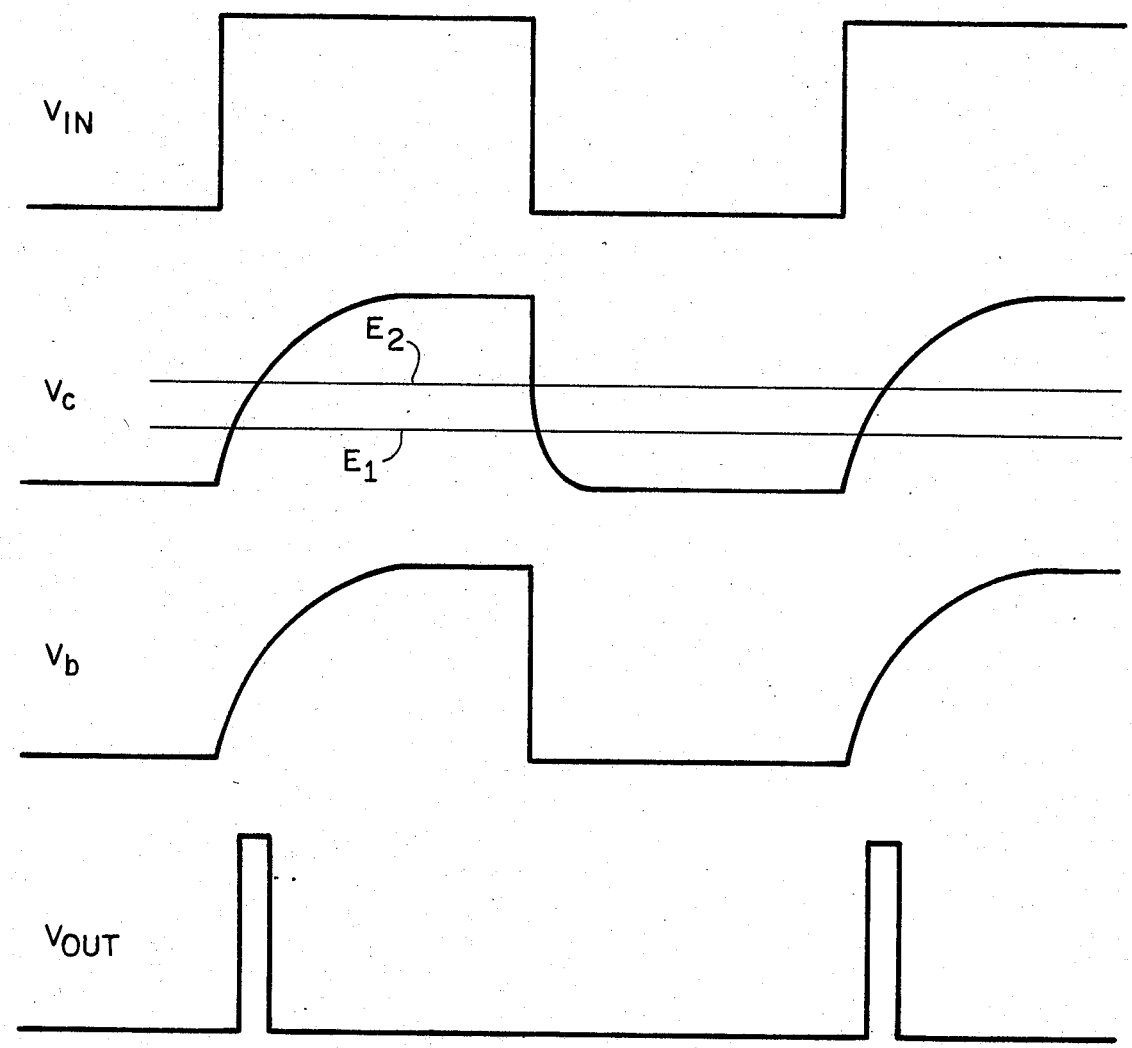
FIG. 2 is a diagram illustrating wave shapes encountered in the circuit of FIG. 1.

The principles of operation of the invention can be understood by referring to the circuit diagram and truth table of FIG. 1 together with the wave shapes depicted in FIG. 2.

Assume the $V_{in}$ square wave of FIG. 2 is applied to the buffer comparator 11 of FIG. 1 and that the magnitude of $V_{in}$ is sufficient to trigger that comparator.

As is known in the art, comparators such as comparator 11 exhibit a very high input impedance and substantially zero output impedance when the comparator is saturated. The high input impedance of the comparator isolates the input and output signals associated with the device whereas low output impedance permits the capacitor to charge and discharge essentially free of any impedance effects of the comparator. As previously stated, the resistance of resistor 15 is selected to be much less than that of resistor 17. Assuming that the input impedance of the comparator 11 is much higher than the resistance of the resistor 17 in the R-C network, it can be shown that the voltage across capacitor 19 in response to the input voltage waveform $V_{in}$ of FIG. 2 can be described as $$V_c \approx V_{cc}\left(1 - e^{-\frac{t}{RC}}\right)$$

where R=the resistance of resistor 17 and C=the capacitance of capacitor 19, as depicted in FIG. 2.

Because of the low value of the resistor 15 with respect to resistor 17 and the input impedances of comparators 25 and 27 the buffer comparator output voltage $V_b$ essentially duplicates the capacitor voltage $V_c$ during the charging portion of the cycle as can be seen in FIG. 2. Thus the resistor 15 effectively remains "invisible" during this portion of the cycle.

As the capacitor voltage rises above the $E_1$ threshold, the switching logic features of the comparators 25 and 27 come into play and a high level output signal commences at this time.

As the capacitor voltage continues to rise and penetrates the $E_2$ threshold, the output reverts to a low level thus terminating the output pulse.

At the termination of the $V_{in}$ signal to the buffer comparator 11, this comparator is switched off, causing the voltage $V_b$ to drop rapidly and turn off the comparator 27 almost immediately. The capacitor 19 then discharges through the resistor 15 causing a small but significant delay in the switching of the comparator 25.

If resistor 15 were not used and the output of the buffer comparator 11 were connected directly to the active input terminals of both logic comparators, normal discharge of the capacitor 19 would cause comparator 25 to cut off as the capacitor voltage fell below the $E_2$ threshold while comparator 27 was still "on", thereby producing an unwanted positive output pulse at this time. Thus the resistor 15 functions as a switching sequence controller that permits comparator 27 to switch on before comparator 25 is switched on when capacitor 19 is being charged, but reverses the normal switching sequence when capacitor 19 is being discharged.

Resistor 29 and capacitor 31 operate in a manner known in the art to absorb extraneous oscillations that may occur as a result of switching transients as the various comparators change state. If more elaborate control of these transients is desired, various methods employing controlled positive feedback are known in the art. Such methods produce a "hysteresis" or "backlash" effect but provide an output that is essentially free of unwanted oscillations. A discussion of such oscillation suppression methods appears, for instance, in: Electronic Designer's Handbook - 3rd Edition, written by Thomas Keith Hemingway and published by Tab Books, Blue Ridge Summit, Pa. in 1979.

It will be appreciated that the circuit of FIG. 1 permits the output pulse to be delayed over a wide range of time intervals merely by adjusting the R-C values according to well known techniques.

Similarly, the output pulse duration can readily be varied over a wide range of values merely by adjusting the values of the resistors comprising the multiple voltage divider so as to provide suitably spaced $E_1$ and $E_2$ values.

Although a rectangular input wave has been depicted in FIG. 2, it will be appreciated that the characteristics of the wave are not ctitical. The leading edge of the input wave must merely rise beyond the switching level of the input comparator and remain above that level until after the termination of the output pulse.

Figure 3:
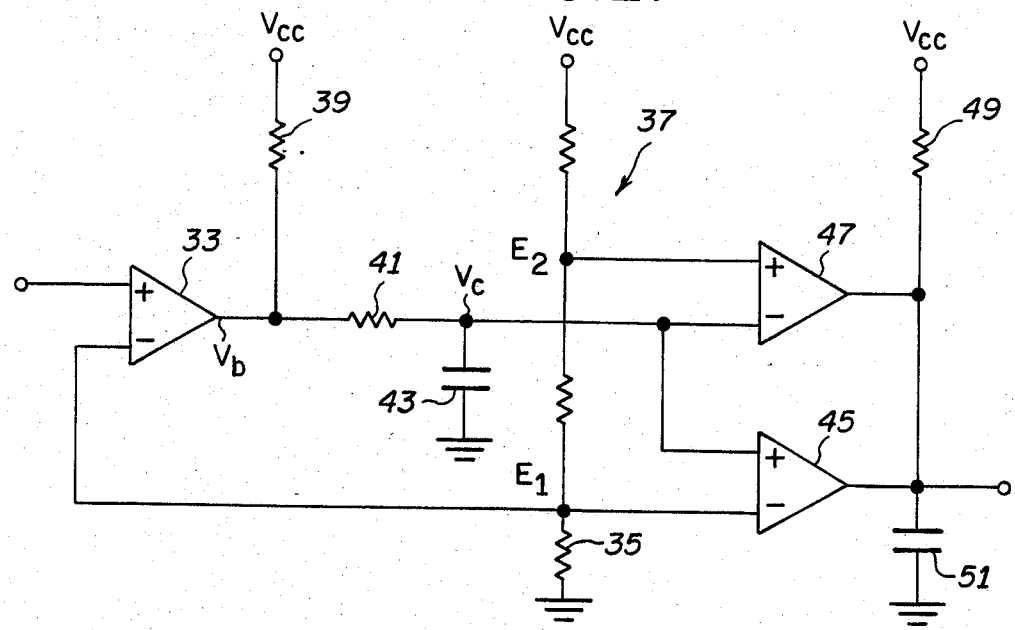
FIG. 3 is a circuit diagram of an alternative form of the invention.

A variation of the circuit of FIG. 1 that may be used to provide delayed pulses of specified duration after both the positive and negative going transitions of the input wave is depicted in FIG. 3.

An input comparator 33 is coupled to receive input signals at its non-inverting input terminal and having its inverting input terminal coupled to ground through a resistor 35 in a multiple voltage divider 37. The output of the comparator which is used to initiate internal driving signals is coupled to a positive voltage source $V_{cc}$ through a resistor 39 and to an R-C network comprising a relatively low-valued resistor 41 and a capacitor 43. The output of the R-C network is applied to the non-inverting terminal of an output comparator 45 and the inverting terminal of an output comparator 47. The remaining input terminals of the output comparators 45 and 47 are connected to the $E_1$ and $E_2$ junctions, respectively, in the multiple voltage divider.

As in the circuit of FIG. 1, the output comparators 45 and 47 operate as an amplitude sensitive logic circuit that produces a high level output signal when the voltage applied to their active input terminals lies between the $E_1$ and $E_2$ threshold values.

Figure 4:
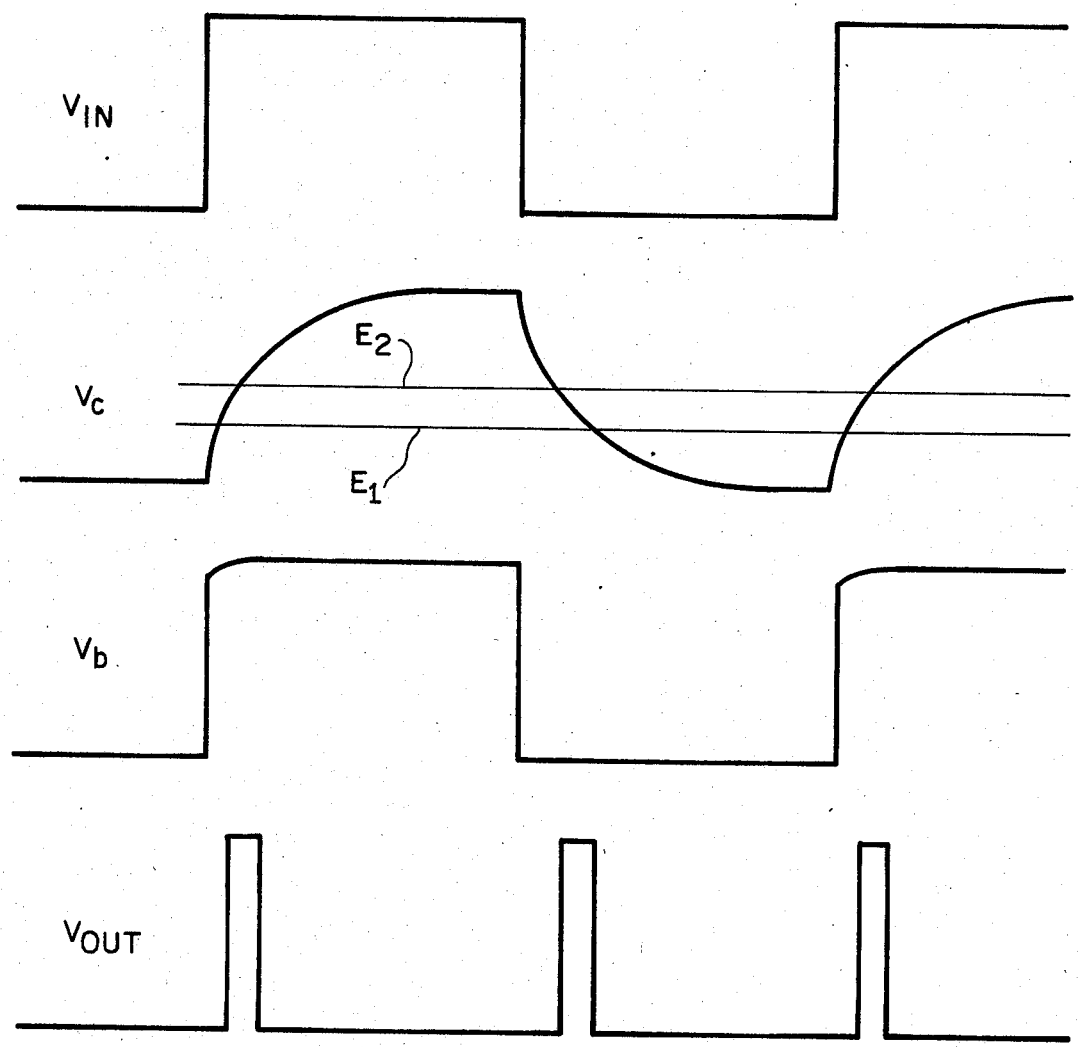
FIG. 4 is a diagram illustrating wave shapes encountered in the circuit of FIG. 3.

As depicted in FIG. 4, the positive-going edge of the input signal $V_{in}$ triggers the input buffer comparator providing a positive-going voltage $V_b$ at its output terminal and an exponentially rising voltage $V_c$ at the junction of the resistor 41 and capacitor 43.

As the voltage $V_c$ rises through the $E_1$ threshold, the logic circuit is switched to a high output state so as to produce a positive output pulse that persists until the voltage $V_c$ penetrates the $E_2$ threshold.

At the termination of the input pulse, the capacitor 43 in the R-C circuit discharges exponentially through the $E_2$ and then the $E_1$ threshold. During the time that the voltage $V_c$ is passing between these thresholds, the logic circuit again produces a high level positive output pulse.

Both output pulses are delayed for a time dependent upon the parameters of the R-C network and have a duration determined by the difference between the $E_1$ and $E_2$ thresholds.

As in the circuit of FIG. 1, a pull-up and filtering circuit comprised of a resistor 49 and capacitor 51 may be used to absorb unwanted switching transients if desired. Alternatively, hysteresis type circuits may be provided as discussed with respect to FIG. 1.

Multivibrators constructed in accordance with the principles of the present invention are relatively simple and eliminate the need for elaborate de-coupling or ground planes and shields. The circuit operates well in noisy environments and may easily be adjusted to operate over many decades of delay and pulse duration.

While the invention has been described in its preferred embodiments, it is to be understood that the words which have been used are words of description rather than limitation and that changes may be made within the purview of the appended claims without departing from the true scope and spirit of the invention in its broader aspects.

What is claimed is:

1. A delayed monostable multivibrator comprising:
   means for providing an input voltage;
   means for providing a source voltage between first and second terminals;
   a voltage divider coupled between said first and second terminals of said source voltage means and having first and second output terminals whereat first and second voltages respectively are provided;
   an input comparator having a first input terminal coupled to said input voltage means, a second input terminal coupled to said first output terminal of said voltage divider, and an output terminal whereto a high level voltage is coupled when said voltage exceeds said first voltage;
   a time delay network having first and second resistors each having first and second terminals, said first terminal of said first resistor coupled to said first terminal of said voltage source means, said second terminal of said first resitor coupled to said first terminal of said second resistor thereby forming a junction, and said second terminal of said second resistor coupled to said output terminal of said input comparator, said time delay network further having a capacitor coupled between said second terminal of said voltage source means and said junction;
   amplitude sensitive logic means having first and second input terminals respectively coupled to said first and second output terminals of said voltage divider, a third input terminal coupled to said output terminal of said input comparator, and a fourth input terminal coupled to said junction, said amplitude sensitive logic means further having an output terminal whereat a high level output voltage is provided when and only when a voltage level at said junction in said time delay network is between said first and second voltages of said voltage divider.

2. The multivibrator of claim 1 wherein said amplitude sensitive logic means includes first and second output comparators, said first output comparator having an inverting input terminal coupled to said first output terminal of said voltage divider to receive said first voltage and a noninverting input terminal coupled to said output terminal of said input comparator and said second output comparator having a noninverting input terminal coupled to said second terminal of said voltage divider and an inverting terminal coupled to said junction in said time delay network, said first and second output comparators each having an output terminal coupled to said output terminal of said amplitude sensitive logic means.

3. The multivibrator of claim 2 wherein resistance values of said first and second resistors of said time delay network are chosen such that said first resistor is of a resistance value that is much greater than said second resistor resistance value.

4. A delayed monostable multivibrator comprising:
   means for providing an input voltage;
   means for providing a source voltage between first and second terminals;
   a voltage divider coupled between said first and second terminals of said source voltage means and having first and second output terminals whereat first and second voltages, respectively, are provided;
   an input comparator having a first input terminal coupled to said input voltage means, a second input terminal coupled to said first output terminal of said voltage divider, and an output terminal whereto a high level voltage is coupled when said input voltage exceeds said first voltage;
   a time delay network including a first resistor having a first and second terminals, said first terminal of said first resistor coupled to said first terminal of said source voltage means, a second resistor having first and second terminals, said first terminal of said second resistor coupled to said second terminal of said first resistor and said output terminal of said input comparator, said time delay network further including a capacitor coupled between said second terminal of said source voltage means and said second terminal of said second resistor to form a junction; and
   amplitude sensitive logic means having first and second input means respectively coupled to said first and second output terminals of said voltage divider, third input means coupled to said junction in said time delay network, said amplitude sensitive logic means further having an output terminal whereat a high level output voltage is provided when and only when a voltage level at said junction in said time delay network exceeds said first voltage of said voltage divider and does not exceed said second voltage of said voltage divider.

5. The multivibrator of claim 4 wherein said amplitude responsive logic means includes:
   a first output comparator having an output terminal coupled to said output terminal of said amplitude sensitive logic means, a noninverting input terminal coupled to said second output terminal of said voltage divider, and an inverting input terminal coupled to said junction in said said time delay network;
   a second output comparator having an output terminal coupled to said output terminal of said amplitude sensitve logic means, a noninverting input terminal coupled to said and an inverting input terminal coupled to said first output terminal of said voltage divider;
   said first and second output comparators constructed and arranged to couple a high level voltage to said output terminal of said amplitude sensitive logic means when and only when a voltage level at said junction in said time delay network exceeds said first voltage of said voltage divider and does not exceed said second voltage of said voltage divider.

6. The multivibrator of claim 5 wherein said first and second resistors of said time delay network are choosen such that said first resistor is of a resistance value that is much greater than said second resistor resistance value.

* * * * *